(12) United States Patent
Hsiung et al.

(10) Patent No.: US 12,080,597 B2
(45) Date of Patent: Sep. 3, 2024

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Te-Chih Hsiung, Taipei (TW); Jyun-De Wu, New Taipei (TW); Peng Wang, Hsinchu (TW); Huan-Just Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 257 days.

(21) Appl. No.: 17/402,157

(22) Filed: Aug. 13, 2021

(65) Prior Publication Data
US 2023/0047598 A1 Feb. 16, 2023

(51) Int. Cl.
| | |
|---|---|
| *H01L 21/768* | (2006.01) |
| *H01L 21/02* | (2006.01) |
| *H01L 21/311* | (2006.01) |
| *H01L 23/535* | (2006.01) |
| *H01L 29/40* | (2006.01) |

(Continued)

(52) U.S. Cl.
CPC .. *H01L 21/76895* (2013.01); *H01L 21/02252* (2013.01); *H01L 21/31116* (2013.01); *H01L 21/31144* (2013.01); *H01L 21/76805* (2013.01); *H01L 21/76829* (2013.01); *H01L 23/535* (2013.01); *H01L 29/401* (2013.01); *H01L 29/41791* (2013.01); *H01L 29/66795* (2013.01); *H01L 29/7851* (2013.01)

(58) Field of Classification Search
CPC ......... H01L 21/76895; H01L 21/02252; H01L 21/31116; H01L 21/31144; H01L 21/76805; H01L 21/76829; H01L 23/535; H01L 29/401; H01L 29/41791; H01L 29/66795; H01L 29/7851; H01L 21/76849; H01L 29/785; H01L 21/823475; H01L 21/823431; H01L 27/0886
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |

(Continued)

FOREIGN PATENT DOCUMENTS

TW 202125708 A 7/2021

*Primary Examiner* — Farun Lu
(74) *Attorney, Agent, or Firm* — Slater Matsil, LLP

(57) ABSTRACT

Semiconductor devices and methods of manufacturing the semiconductor devices are described herein. A method includes forming a first etch stop layer from a portion of a gate mask, the gate mask extending between spacers adjacent a gate electrode, the gate electrode overlying a semiconductor fin. The method further includes forming a second etch stop layer adjacent the first etch stop layer, forming an opening through the second etch stop layer, and exposing the first etch stop layer by performing a first etching process. The method further includes extending the opening through the first etch stop layer and exposing the gate electrode by performing a second etching process. Once the gate electrode has been exposed, the method further includes forming a gate contact in the opening.

20 Claims, 10 Drawing Sheets

(51) Int. Cl.
    *H01L 29/417*     (2006.01)
    *H01L 29/66*     (2006.01)
    *H01L 29/78*     (2006.01)

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 11,031,340 B2 * | 6/2021 | Shin .................... H01L 23/5226 |
| 2012/0098073 A1 * | 4/2012 | Yu ..................... H01L 21/76802 |
| | | 257/288 |
| 2015/0214226 A1 * | 7/2015 | Su ..................... H01L 21/02299 |
| | | 438/760 |
| 2019/0035638 A1 * | 1/2019 | Fan ..................... H01L 21/0338 |
| 2020/0058769 A1 * | 2/2020 | Khaderbad ......... H01L 29/0847 |
| 2021/0193534 A1 | 6/2021 | Chen et al. |
| 2021/0202744 A1 | 7/2021 | You et al. |
| 2023/0005795 A1 * | 1/2023 | Li ....................... H01L 29/6653 |

\* cited by examiner

SEMICONDUCTOR DEVICES AND METHODS OF MANUFACTURE

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a three-dimensional view of an intermediate structure of the finFET device. FIGS. 2-10 are cross-sectional views of further processing of the intermediate structure.

FIG. 1 illustrates the formation of fins, isolation regions, dummy dielectric and a dummy gate, in accordance with some embodiments.

FIG. 2 illustrates the formation of source/drain regions, gate spacers and dummy gate masks, in accordance with some embodiments.

FIG. 3 illustrates the formation of a first etch stop layer and a first interlayer dielectric (ILD), in accordance with some embodiments.

FIG. 4 illustrates the replacement of the dummy dielectric and the dummy gate with gate dielectric layers and metal gates, in accordance with some embodiments.

FIG. 5 illustrates the formation of a second etch stop layer and a gate mask, in accordance with some embodiments.

FIG. 6 illustrates the formation of silicide regions and source/drain contacts, in accordance with some embodiments.

FIG. 7 illustrates the formation of a selective etch stop layer, a contact etch stop layer, a second interlayer dielectric, in accordance with some embodiments.

FIG. 8 illustrates an etching process in the formation of openings for gate contacts, in accordance with some embodiments.

FIG. 9 illustrates the formation of gate contacts of a first semiconductor device, in accordance with some embodiments.

FIG. 10 illustrates the formation of source/drain contacts and butted contacts of a second semiconductor device, in accordance with some embodiments.

DETAILED DESCRIPTION

Figure 1:
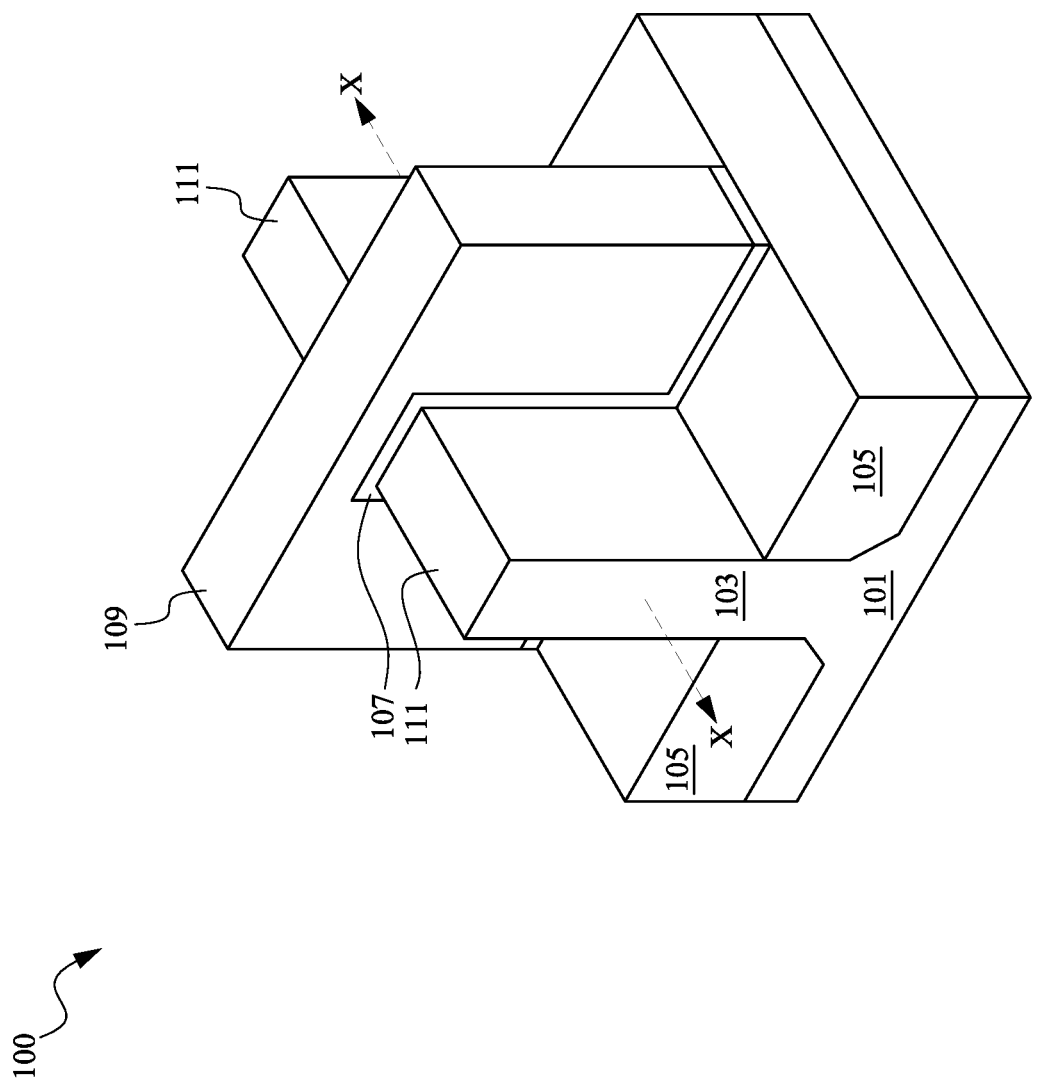
FIGS. 1-10 illustrate intermediate stages in the manufacturing of finFET devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure relates to a semiconductor device and its manufacturing method, and more particularly to a semiconductor device comprising a fin field effect transistor (finFET) and a method of manufacturing the semiconductor device. Embodiments disclosed herein are directed towards the formation of a plurality of fin-type field effects transistors (finFETs) within a wafer. Each of FIGS. 1-10 illustrate intermediate steps in the fabrication of the finFETs with FIGS. 2-10 using cross-sectional views that are taken through an intermediate structure formed using the intermediate steps associated with the respective figures. The cross-sectional views taken through line X-X illustrated in association with FIG. 1.

FIG. 1 illustrates a three-dimensional view of an intermediate structure 100 formed during the formation of a finFET device, in accordance with some embodiments. The intermediate structure 100 comprises a fin 103 on a substrate 101 (e.g., a semiconductor substrate). Isolation regions 105 are disposed in the substrate 101, and the fin 103 protrudes above and from between neighboring isolation regions 105. Although the isolation regions 105 are described and/or illustrated as being separate from the substrate 101, as used herein the term "substrate" may be used to refer to just a semiconductor substrate or a semiconductor substrate inclusive of the isolation regions 105. Additionally, although the fin 103 is illustrated as a single, continuous material as the substrate 101, the fin 103 and/or the substrate 101 may comprise a single material or a plurality of materials. In this context, the fin 103 refers to the portion extending between the neighboring isolation regions 105.

A dummy gate dielectric layer 107 is along sidewalls and over a top surface of the fin 103, and a dummy gate electrode 109 is over dummy gate dielectric layer 107. Source/drain regions 111 (once regrown) are disposed in opposite sides of the fin 103 with respect to dummy gate dielectric layer 107 and dummy gate electrode 109. FIG. 1 further illustrates reference cross-section X-X that is used in later figures. Cross-section X-X is perpendicular to a longitudinal axis of the dummy gate electrode 109 of the finFET and extends through the source/drain regions 111 on opposing sides of the dummy gate electrode 109 of the finFET in a direction parallel to, for example, a current flow between the source/drain regions 111 of the finFET. Subsequent figures refer to this reference cross-section X-X for clarity.

Some embodiments discussed herein are discussed in the context of finFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NS-FETs), or the like.

Figure 2:
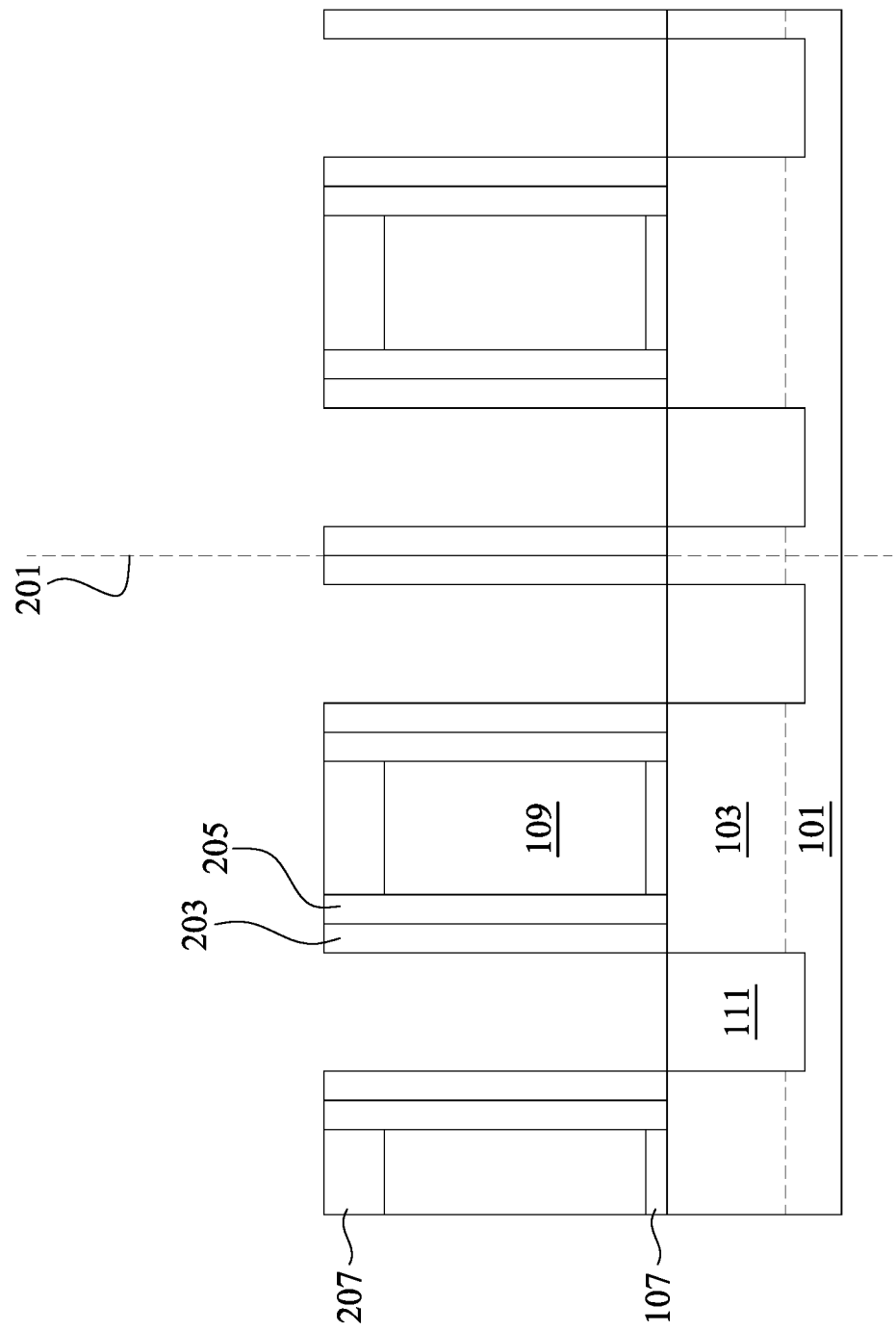

With reference to FIGS. 1 and 2, these figures illustrate some initial steps in the formation of finFETs including patterning a plurality of the fins 103 from the substrate 101. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor. The fins 103 may be patterned by forming trenches using any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 103.

However, as one of ordinary skill in the art will recognize, the processes and materials described above to form the series of fins 103 are merely example processes, and are not meant to be the only embodiments. Rather, any suitable process through which the fins 103 may be formed may be utilized and any suitable process, including any number of masking and removal steps may be used. Once formed, these fins 103 may be used, as discussed below, to form the channel regions and source/drain regions 111 of a plurality of finFET transistors. While FIG. 1 only illustrates one of the fins 103 formed from the substrate 101, any number of the fins 103 may be utilized.

After the fins 103 have been formed within the substrate 101, isolation regions 105, such as shallow trench isolation (STI) regions may be formed to isolate the fins 103 from other regions within the substrate 101. As such, the trenches may be filled with a dielectric material and the dielectric material may be recessed within the first trenches to form the isolation regions 105. The dielectric material may be an oxide material, a high-density plasma (HDP) oxide, or the like. The dielectric material may be formed, after an optional cleaning and lining of the trenches, using either a chemical vapor deposition (CVD) method, a high density plasma CVD method, or any other suitable method of formation may be used.

The trenches may be filled by overfilling the trenches and the substrate 101 with the dielectric material and then removing the excess material outside of the trenches and the fins 103 through a suitable process such as chemical mechanical polishing (CMP), an etch, a combination of these, or the like. In an embodiment, the removal process removes any dielectric material that is located over the fins 103 as well, so that the removal of the dielectric material will expose the surface of the fins 103 to further processing steps.

Once the trenches have been filled with the dielectric material, the dielectric material may then be recessed away from the surface of the fins 103. The recessing may be performed to expose at least a portion of the sidewalls of the fins 103 adjacent to the top surface of the fins 103. The dielectric material may be recessed using a wet etch by dipping the top surface of the fins 103 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 103 of between about 50 Å and about 500 Å, such as about 400 Å. Additionally, the recessing may also remove any leftover dielectric material located over the fins 103 to ensure that the fins 103 are exposed for further processing.

The steps described above may be only part of the overall process flow used to fill and recess the dielectric material. For example, lining steps, cleaning steps, annealing steps, gap filling steps, combinations of these, and the like may also be utilized to form and fill the trenches with the dielectric material. All of the potential process steps are fully intended to be included within the scope of the present embodiment.

After the isolation regions 105 have been formed, appropriate wells (not shown) may be formed in the fins 103 and/or the substrate 101. In some embodiments, different well types are formed within different n-type regions and the p-type regions of the fins 103 and/or the substrate 101. As such, the different implant steps for the n-type regions and the p-type regions may be achieved using a photoresist and/or other masks (not shown). For example, a photoresist may be formed over the fins 103 and the isolation regions 105 in the n-type regions. The photoresist is patterned to expose the p-type regions of the substrate 101. The photoresist can be formed by using a spin-on technique and can be patterned using acceptable photolithography techniques. Once the photoresist is patterned, an n-type impurity implant is performed in the p-type regions, and the photoresist may act as a mask to substantially prevent n-type impurities from being implanted into the n-type regions. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type regions, a photoresist can be formed over the fins 103 and the isolation regions 105 in the p-type region and then patterned to expose the n-type regions of the substrate 101 to initiate an implanting of the n-type regions. Once the photoresist is patterned, a p-type impurity implant may be performed in the n-type regions using the photoresist as a mask to substantially prevent p-type impurities from being implanted into the p-type regions. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type regions and the p-type regions, an anneal process may be performed to repair implant damage and to activate the p-type and/or n-type impurities that were implanted. In some embodiments in which the fins 103 or a portion of the fins 103 are grown, the grown materials of epitaxial of the fins 103 may be in situ doped during growth, which may obviate the implantations, although in situ and implantation doping may be used together.

Once the wells have been formed in the fins 103 and/or the substrate 101, a dummy gate dielectric layer 107 and a dummy gate electrode 109 may be formed over each of the fins 103. Initially, a dummy gate dielectric (or interface oxide) layer and a dummy gate electrode layer over the dummy gate dielectric layer may be formed over each of the fins 103. In an embodiment the dummy gate dielectric layer may be formed by thermal oxidation, chemical vapor deposition, sputtering, or any other methods known and used in the art for forming a gate dielectric layer. Depending on the technique of formation, the dummy gate dielectric layer thickness on the top of the fins 103 may be different from the dummy gate dielectric layer thickness on the sidewall of the fins 103.

The dummy gate dielectric layer may comprise a material such as silicon dioxide or silicon oxynitride with a thickness of between about 3 Å and about 100 Å, such as about 10 Å. The dummy gate dielectric layer may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of between about 0.5 Å and about 100 Å, such as about 10 Å or less. Additionally, any combination of silicon dioxide, silicon oxynitride, and/or high-k materials may also be used for the dummy gate dielectric layer.

The dummy gate electrode layer may comprise a conductive material and may be selected from a group comprising of polysilicon (e.g., a dummy polysilicon (DPO)), W, Al, Cu, AlCu, W, Ti, TiAlN, TaC, TaCN, TaSiN, Mn, Zr, TiN, Ta, TaN, Co, Ni, combinations of these, or the like. The dummy gate electrode layer may be deposited by chemical vapor deposition (CVD), sputter deposition, or other suitable techniques for depositing conductive materials. The thickness of the dummy gate electrode layer may be between about 5 Å and about 200 Å. The top surface of the dummy gate electrode layer may have a non-planar top surface, and may be planarized prior to patterning of the dummy gate electrode layer or performing the gate etching process. Ions may or may not be introduced into the dummy gate electrode layer at this point. Ions may be introduced, for example, by ion implantation techniques.

Once formed, the dummy gate dielectric layer and the dummy gate electrode layer may be patterned to form a series of dummy gate dielectric layer 107 and dummy gate electrodes 109 over the fins 103. The dummy gate electrodes 109 may be formed by depositing and patterning a hard mask 207 on the dummy gate electrode layer using, for example, any suitable deposition and photolithography techniques. The hard mask 207 may incorporate any suitable masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode layer and the dummy gate dielectric layer may be etched using a dry etching process to form the dummy gate electrodes 109 and the dummy gate dielectric layer 107. As such, the dummy gate electrodes 109 define multiple channel regions located on each side of the fins 103 beneath the dummy gate dielectric layer 107.

Turning to FIG. 2, which illustrates additional ones of the dummy gate dielectrics 107 and the dummy gate electrodes 109 over the fin 103, and which also illustrates the fins 103 in different regions of the substrate 101 (represented by the dashed line labeled 201), once the dummy gate electrodes 109 have been patterned, gate spacers 203 may be formed on opposing sides of the dummy gate electrodes 109, according to some embodiments. The gate spacers 203 are formed, for example, by blanket depositing a stack of spacer layers on the previously formed structure. The spacer layer may comprise a different material with different etch characteristics or the same material as the dielectric material within the isolation regions 105. The insulating material of the gate spacers 203 may be silicon oxide, silicon nitride, silicon oxynitride, silicon carbonitride, a combination thereof, or the like. The gate spacers 203 may then be patterned, such as by one or more etches to remove the spacer layer from the horizontal surfaces of the structure, to form the gate spacers 203.

According to some embodiments, optional gate seal spacers 205 may be formed prior to formation of the gate spacers 203. The optional gate seal spacers 205 can be formed by blanket deposition on exposed surfaces of the dummy gate electrodes 109, the masks, and/or the fins 103. The optional gate seal spacers 205 may comprise SiCON, SiN, oxynitride, SiC, SiON, SiOC, oxide, or the like and may be formed by any suitable methods to form such a layer, such as chemical vapor deposition (CVD), plasma enhanced chemical vapor deposition (PECVD), sputter, and any other suitable methods. A thermal oxidation or a deposition followed by an anisotropic etch may form the optional gate seal spacers 205.

After the formation of the gate spacers 203, implants for lightly doped source/drain (LDD) regions (not explicitly illustrated) may be performed. In the embodiments with different device types, similar to the implants discussed above, a mask, such as a photoresist, may be formed over regions of the structure to be protected and appropriate type (e.g., p-type or n-type) impurities may be implanted into the exposed fins 103 in the unmasked region. The mask may then be removed. Subsequent masking and implantation processes may be performed to appropriately dope different regions of the structure based on desired devices being formed. The lightly doped source/drain regions may have a concentration of impurities of from about $10^{15}$ $cm^{-3}$ to about $10^{19}$ $cm^{-3}$. An anneal process may be used to repair implant damage and to activate the implanted impurities.

It is noted that the above disclosure generally describes a process of forming spacers and LDD regions. Other processes and sequences may be used. For example, fewer or additional spacers may be utilized, a different sequence of steps may be utilized (e.g., the optional gate seal spacers 205 may not be etched prior to forming the gate spacers 203, yielding "L-shaped" gate seal spacers), spacers may be formed and removed, and/or the like.

Once the gate spacers 203 have been formed, a removal of portions of the fins 103 not protected by the dummy gate electrodes 109 and the gate spacers 203 are removed using a reactive ion etch (RIE) using the dummy gate electrodes 109 and the gate spacers 203 as hard masks, or by using any other suitable removal process. The removal may be continued until the fins 103 are either planar with or below the surface of the isolation regions 105.

Once the portions of the fins 103 have been removed, the fins 103 are regrown, e.g., through a selective epitaxial (EPI) growth process of the material of the fins 103, to form the source/drain regions 111 of the finFETs being developed. In an embodiment wherein the fins 103 comprise silicon and the finFET is a p-type device, the source/drain regions 111 may be regrown with a material, such as silicon, silicon germanium, silicon phosphorous, which has a different lattice constant than the channel regions. The epitaxial growth process may use precursors such as silane, dichlorosilane, germane, or the like, and may continue for between about 5 minutes and about 120 minutes, such as about 30 minutes. In other embodiments the source/drain regions 111 may comprise materials such as GaAs, GaP, GaN, InP, InAs, InSb, GaAsP, AlGaN, AlInAs, AlGaAs, GaInAs, GaInP, and/or GaInAsP; or combinations, or the like.

Once the source/drain regions 111 are formed, dopants may be implanted into the source/drain regions 111 by implanting appropriate dopants to complement the dopants in the fins 103. For example, p-type dopants such as boron, gallium, indium, or the like may be implanted to form a PMOS device. In another embodiment, n-type dopants such as phosphorous, arsenic, antimony, or the like may be implanted to form an NMOS device. These dopants may be implanted using the dummy gate electrodes 109, the optional gate seal spacers 205 and the gate spacers 203 as masks. However, any other suitable processes, steps, or the like may be used to implant the dopants. For example, a plurality of implantation processes may be performed using various combinations of spacers and liners to form the source/drain regions 111 having a specific shape or characteristic suitable for a particular purpose. Any of these processes may be used to implant the dopants, and the above description is not meant to limit the present embodiments to the steps presented above.

Figure 3:
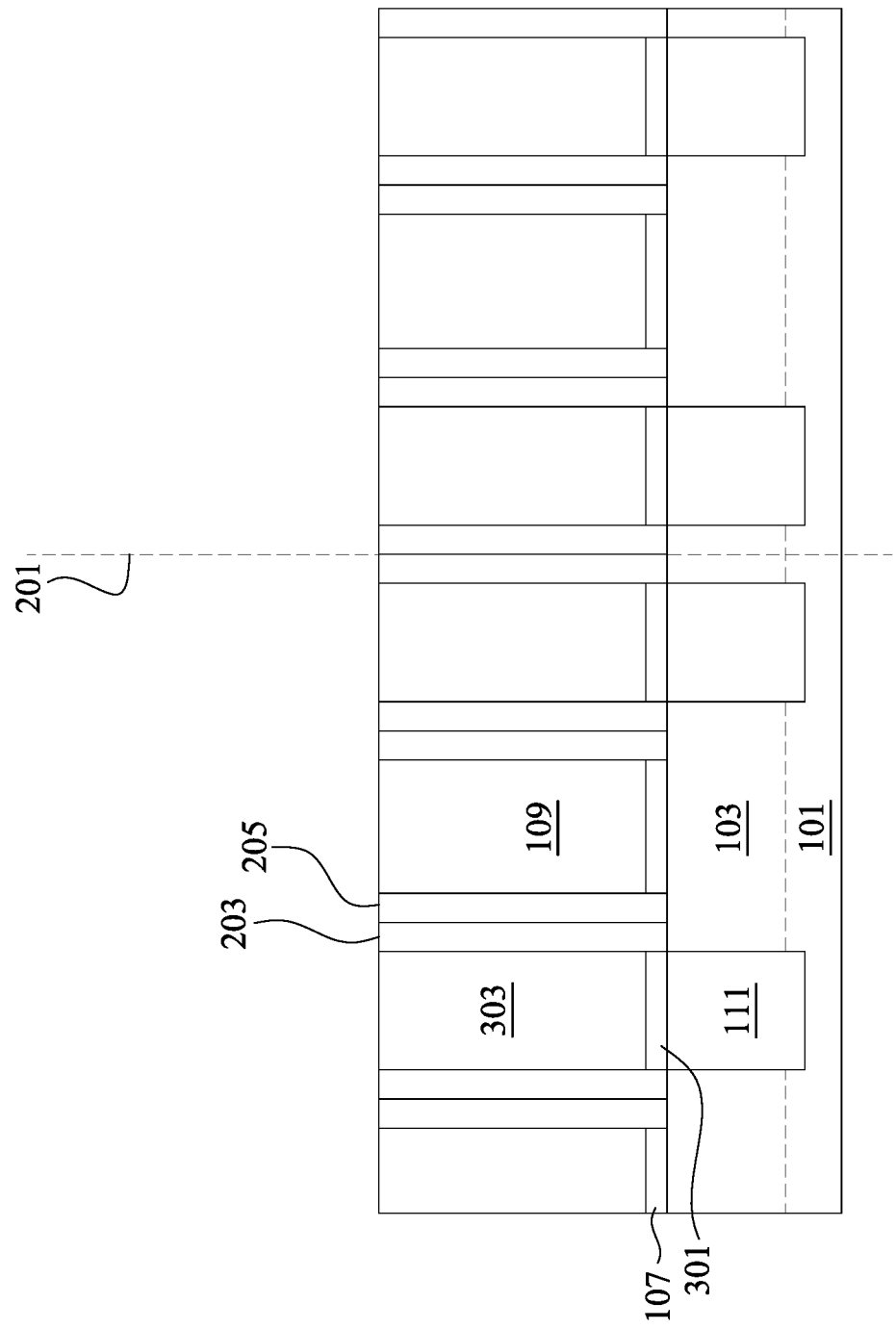

FIG. 3 illustrates a formation of a first interlayer dielectric (ILD) layer 303 (e.g., ILD0 layer) over the source/drain regions 111, according to some embodiments. Once the source/drain regions 111 have been formed, a first etch stop layer 301 may be deposited over the source/drain regions 111 and between the gate spacers 203. In an embodiment the first etch stop layer 301 may be a dielectric material such as silicon nitride, SiCN, or SiCON deposited within a deposition chamber using, for example, one or more of a chemical vapor deposition (CVD), an atomic layer deposition (ALD) process, a plasma enhanced chemical vapor deposition (PECVD), a low pressure chemical vapor deposition (LPCVD), or the like. However, any suitable materials and any suitable processes may be utilized to deposit the first etch stop layer 301.

Then, the first ILD layer 303 (e.g., ILD0 layer) is deposited over the first etch stop layer 301 and exposed areas of the intermediate structure. According to some embodiments, the first ILD layer 303 may comprise a material such as silicon oxide ($SiO_2$) or boron phosphorous silicate glass (BPSG), although any suitable dielectrics may be used. The first ILD layer 303 may be formed using a chemical vapor deposition (CVD) process such as plasma enhanced chemical vapor deposition (PECVD), although any other suitable processes, such as low pressure chemical vapor deposition (LPCVD), may also be used.

Once formed, the first ILD layer 303 may be annealed using, e.g., a first annealing process. In an embodiment the first annealing process may be a thermal anneal wherein the substrate 101 and the first ILD layer 303 are heated within, e.g., in a furnace, within an inert atmosphere. The first anneal process may be performed at a temperature of between about 200° C. and about 1000° C., such as about 500° C., and may be continued for a time of between about 60 s and about 360 min, such as about 240 min. Once deposited and annealed, the first ILD layer 303, the gate spacers 203 and the optional gate seal spacers 205 (if present) are planarized to expose the dummy gate electrodes 109 in a planar surface of the first ILD layer 303, wherein the planarization process may also remove the hard mask 207 if still present.

Figure 4:
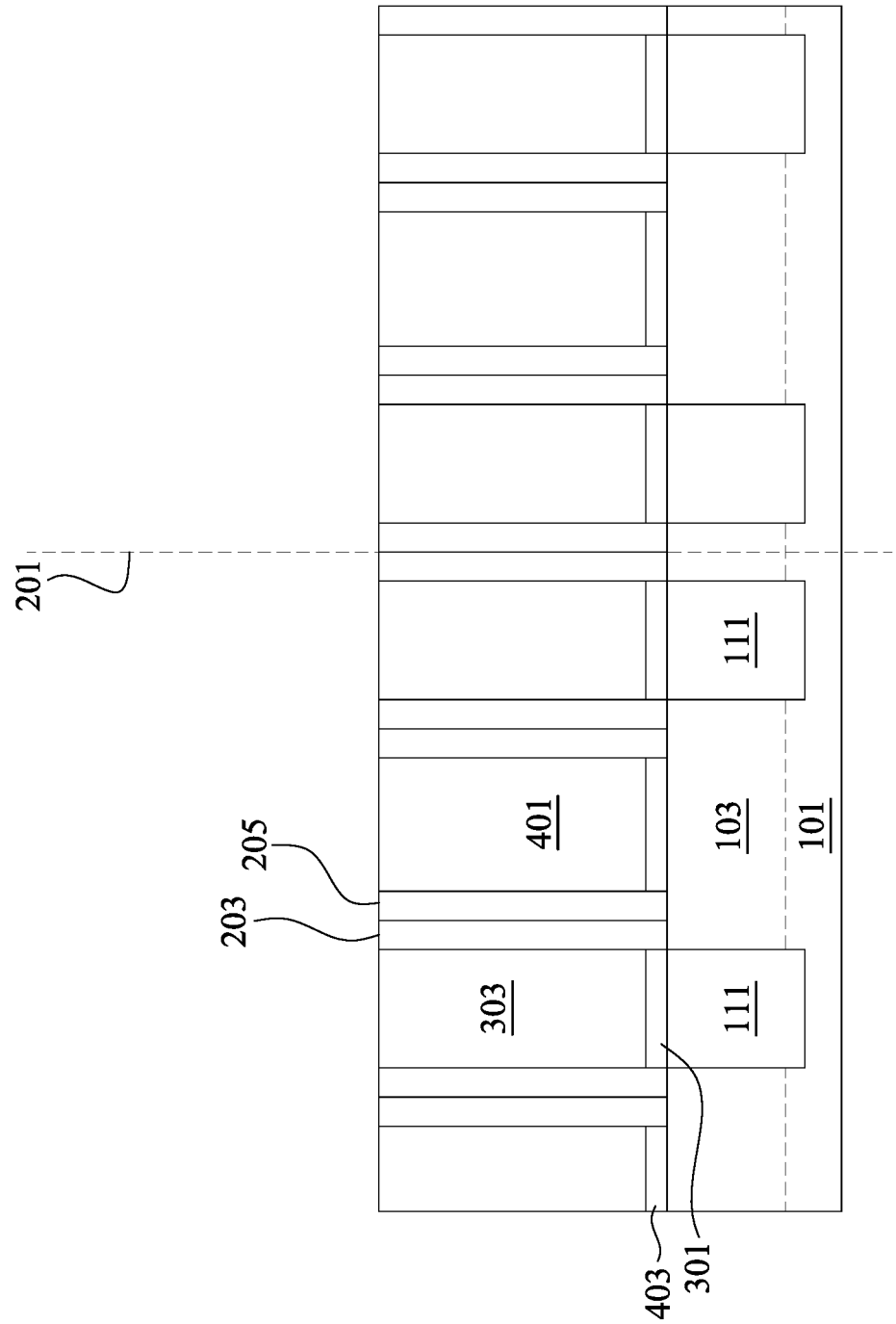

Turning to FIG. 4, once exposed, the dummy gate electrodes 109 and dummy gate dielectric layer 107 are subsequently removed using, e.g., one or more wet etch processes and are replaced with, e.g., high-k gate dielectric layers 403 and metal gates 401, including, for example, one or more conductive barrier layers, one or more work function layers, and a conductive fill material. According to some embodiments, the high-k gate dielectric layer 403 includes materials such as $HfO_2$, $ZrO_2$, $HfZrO_x$, $HfSiO_x$, HfSiON, $ZrSiO_x$, $HfZrSiO_x$, $Al_2O_3$, $HfAlO_x$, HfAlN, $ZrAlO_x$, $La_2O_3$, $TiO_2$, $Yb_2O_3$, or the like and may be a single layer or a composite layer that is formed using a deposition process such as atomic layer deposition. However, any suitable materials and any suitable processes may be used to form the high-k gate dielectric layer 403.

According to some embodiments, the one or more diffusion barrier layers and the one or more work-function layer may be formed as a plurality of stacked layers. For example, the barrier layers may be formed as a layer of titanium nitride (TiN) which may (or may not) be doped with silicon. The work-function layer, in the case of a p-type finFET may be formed with a respective metal gate 401 as a stacked layer including Ti, Al, TiAl, TiAlN, Ta, TaN, TiAlC, TaAlCSi, TaAlC, TiSiN, or the like. In the case of an n-type finFET being formed with a respective metal gate 401, the work-function layer may be formed with a respective metal gate 401 as a stacked layer including TiN, TaN, TiAl, W, Ta, Ni, Pt, or the like. After the deposition of the work-function layer(s) in these embodiments, a barrier layer (e.g., another TiN layer) is formed.

According to some embodiments, the conductive fill material may be formed from a material such as tungsten, cobalt, copper, ruthenium, aluminum, or the like. The conductive fill material is deposited over the stacked layers of the high-k gate dielectric layer 403, the one or more conductive barrier layers, the one or more work function layers such that the remaining spaces, between respective gate spacers 203 of a respective metal gate 401 are filled or over-filled.

Once the layers of the metal gates 401 have been deposited and the remaining spaces are completely filled (or over-filled) with the conductive fill material, the materials are then planarized using a chemical mechanical polish (CMP) process. The CMP process may perform a thinning of the materials of the metal gates 401, the materials of respective gate spacers 203, optional gate seal spacers 205 (if present), and the first ILD layer 303 until planarized surfaces of the metal gates 401 and the gate spacers 203 are exposed in a planar surface of the first ILD layer 303.

Once the first ILD layer 303 has been planarized and the planar surfaces of the metal gates 401 and the gate spacers 203 are exposed, the first ILD layer 303 may again be annealed using, e.g., a second annealing process. In an embodiment the second annealing process may be a thermal anneal wherein the substrate 101 and the first ILD layer 303 are heated within, e.g., a furnace, within an inert atmosphere. The second annealing process may be performed at a temperature of between about 200° C. and about 1000° C., such as about 500° C., and may be continued for a time of between about 60 s and about 360 min, such as about 240 min.

Figure 5:
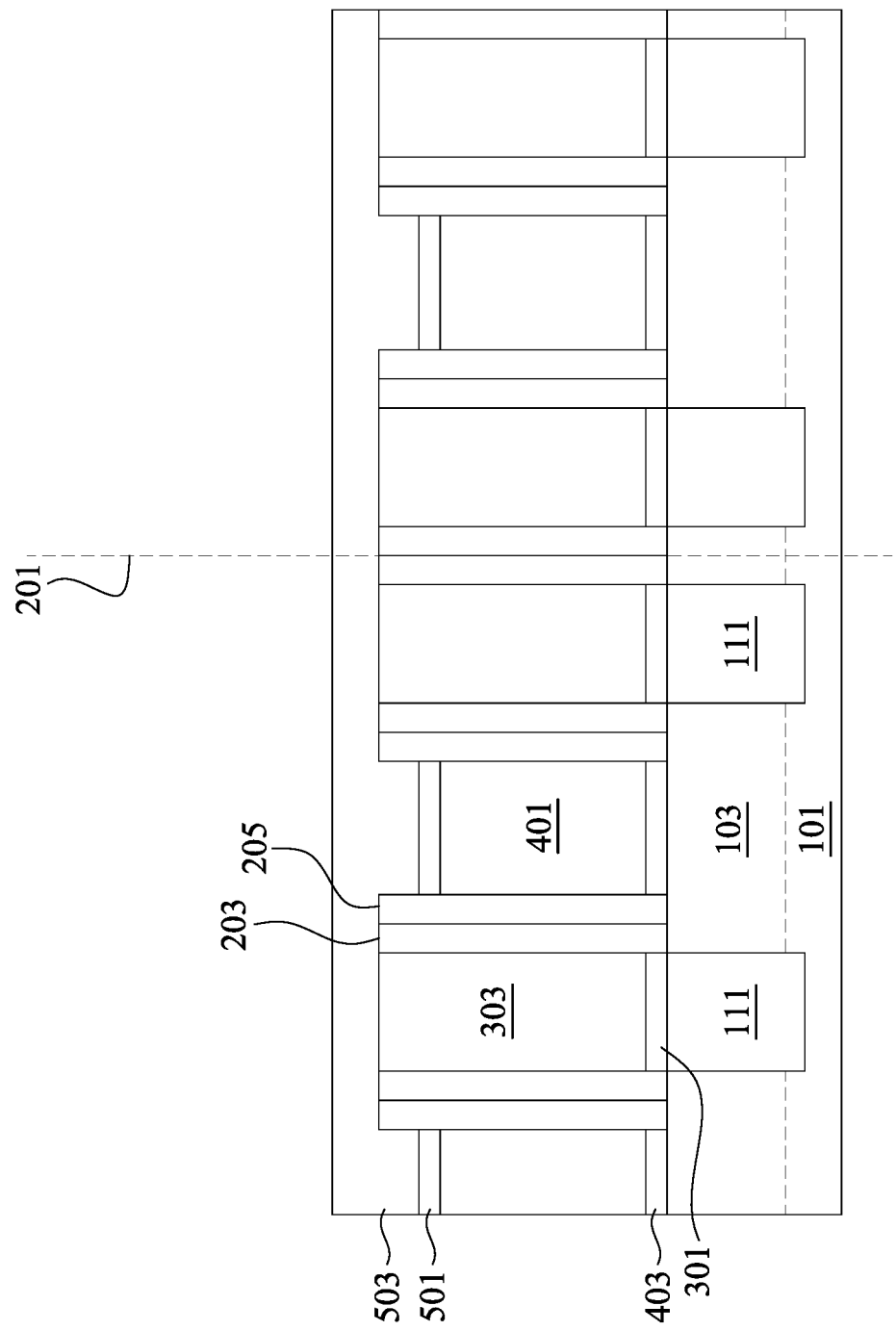

In FIG. 5, the metal gates 401 are recessed and a second etch stop layer 501 may be deposited over the recessed metal gates 401. The second etch stop layer 501 may be formed of tungsten, such as fluorine-free tungsten (FFW), which is deposited by a selective deposition process, such as a selective CVD process. However, the second etch stop layer 501 may include other conductive materials, such as ruthenium, cobalt, copper, molybdenum, nickel, combinations thereof, or the like and may be deposited using a suitable deposition process (e.g., ALD, CVD, PVD, or the like). Because the second etch stop layer 501 is formed of a conductive material, it can act to stop etching, and can also be used to tune the contact resistance to the metal gates 401. In some embodiments, the second etch stop layer 501 includes a dielectric material, such as silicon nitride, silicon oxide, silicon oxynitride, or the like.

A gate mask 503 comprising one or more layers of dielectric material, such as silicon nitride, silicon oxynitride, or the like, is deposited over the second etch stop layer 501 and fills the remainder of the recess. The deposition of the gate mask 503 may be followed by a planarization process to planarize the gate mask 503 and remove any undesired thickness of the dielectric material. The planarization process may be a chemical mechanical polishing process, although any suitable planarization process may be used.

Figure 6:
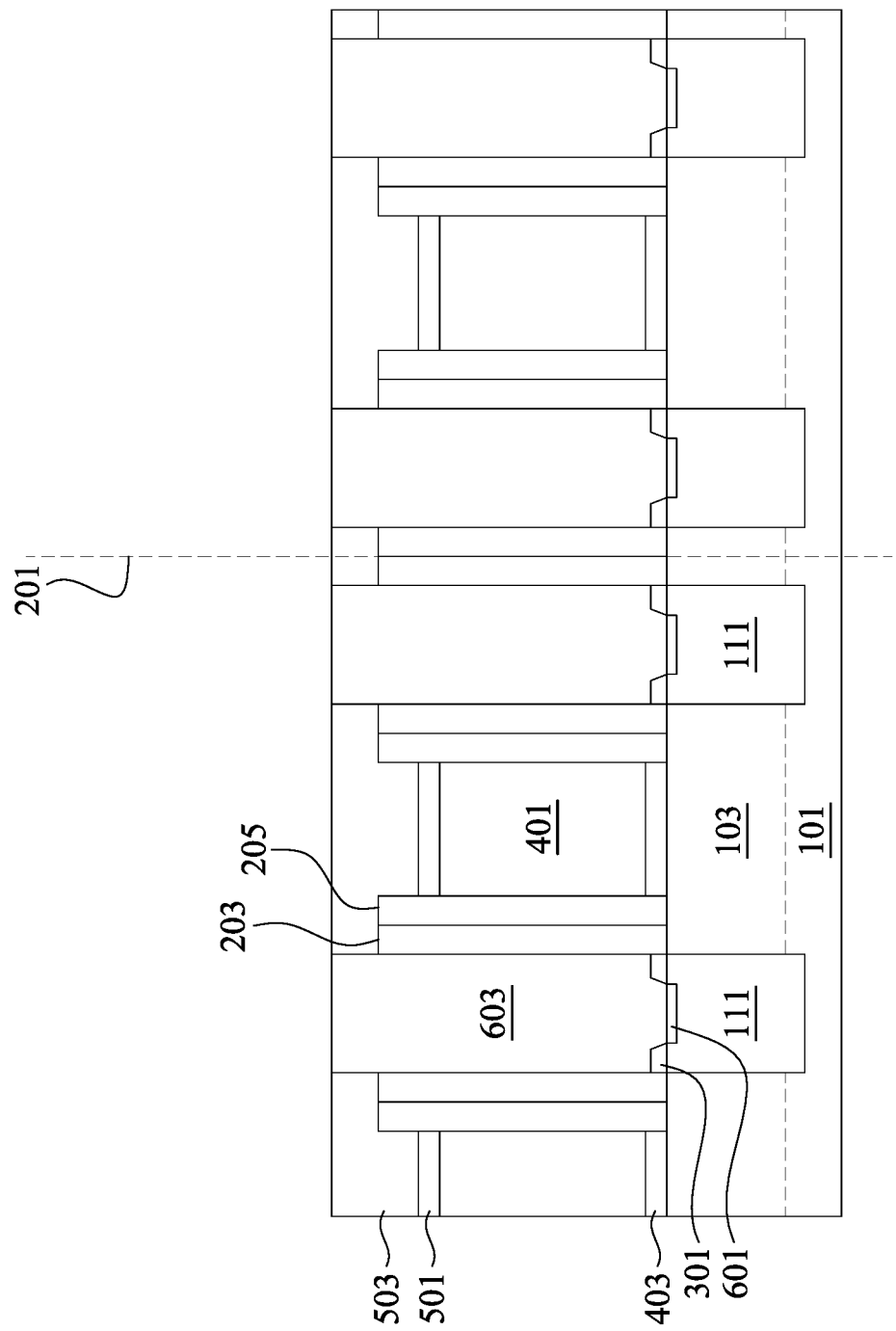

In FIG. 6, silicide regions 601 and source/drain plugs 603 are formed through the first ILD layer 303 and the first etch stop layer 301. The first ILD layer 303 and the first etch stop layer 301 may be etched to form recesses exposing surfaces of the source/drain regions 111. The recesses may be formed by etching using anisotropic etch processes, such as RIE, NBE, or the like. In some embodiments, the recesses may be etched through the first ILD layer 303 using a first etch process and may then be etched through the first etch stop layer 301 using a second etch process. A mask, such as a photoresist, may be formed and patterned over the first ILD layer 303 to mask portions of the first ILD layer 303, the first etch stop layer 301, the gate spacers 203, and the gate mask 503 from the first etch process and the second etch process. In some embodiments, the etch processes may over-etch, and therefore, the recesses may extend into the source/drain regions 111. Bottom surfaces of the recesses may be level with (e.g., at a same level, or having a same distance from the substrate 101), or lower than (e.g., closer to the substrate 101) top surfaces of the source/drain regions 111.

After the recesses are formed, the silicide regions 601 may be formed. In some embodiments, the silicide regions 601 are formed by first depositing a metal (not separately illustrated) capable of reacting with the semiconductor materials of the underlying source/drain regions 111 (e.g., silicon, silicon germanium, germanium, or the like) to form silicide or germanide regions, such as nickel, cobalt, titanium, tantalum, platinum, tungsten, other noble metals, other refractory metals, rare earth metals or their alloys, over the exposed portions of the source/drain regions 111. A thermal anneal process may then be performed to form the silicide regions 601. Un-reacted portions of the deposited metal are removed by an etch process. Although referred to as silicide regions, the silicide regions 601 may be replaced by germanide regions, silicon germanide regions (e.g., regions comprising silicide and germanide), or the like. In an embodiment, the silicide regions 601 comprise TiSi, and have a thickness ranging from about 2 nm to about 10 nm.

The source/drain plugs 603 are then formed over the silicide regions 601 and filling the recesses. The source/drain plugs 603 may each comprise one or more layers, such as barrier layers, diffusion layers, and fill materials. For example, in some embodiments, the source/drain plugs 603 each include a barrier layer and a conductive material over the barrier layer. The conductive material of each of the source/drain plugs 603 may be electrically coupled to the underlying source/drain regions 111 through the silicide regions 601. The barrier layer may include titanium, titanium nitride, tantalum, tantalum nitride, or the like. The conductive material may be cobalt (Co), ruthenium (Ru), titanium (Ti), tungsten (W), copper (Cu), a copper alloy, silver (Ag), gold (Au), aluminum (Al), nickel (Ni), or the like. After the source/drain plugs 603 are formed, a planarization process, such as a CMP, may be performed to remove excess material from surfaces of the first ILD layer 303 and the gate mask 503.

Figure 7:
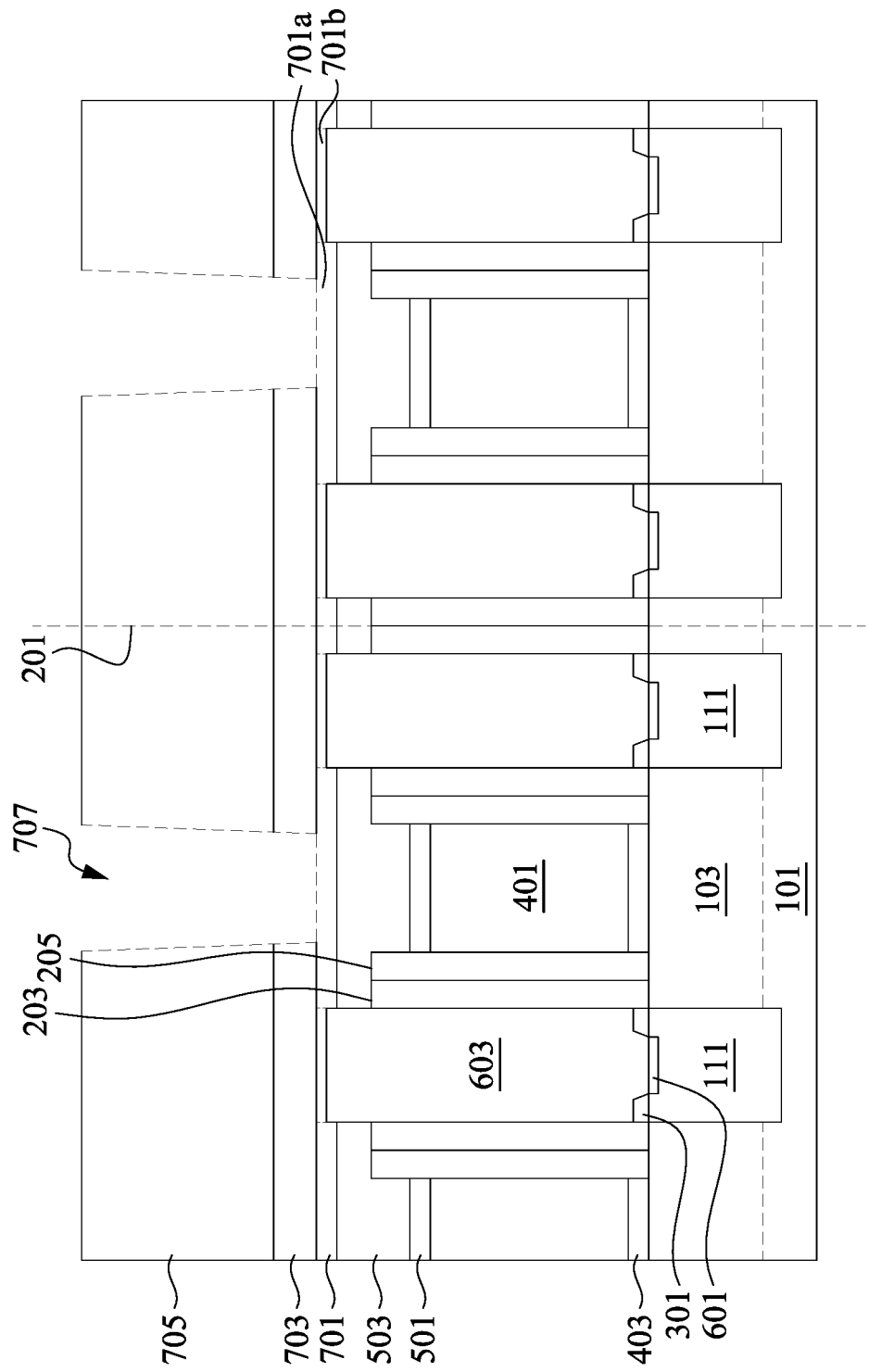

In FIG. 7, a selective etch stop layer 701 is formed over exposed surfaces of the gate mask 503 and the source/drain plugs 603, according to some embodiments. In some embodiments, the selective etch stop layer 701 may be formed as a $SiN_xO_y$ native oxide layer (see, e.g., 701a in FIG. 7) over the gate mask 503 and as a $Co_xO_y$ layer (see, e.g., 701b in FIG. 7, separated from the $SiN_xO_y$ native oxide layer 701a by dashed lines) over the source/drain plugs 603 by exposing the intermediate structure to air. The intermediate structure may be exposed to air for a time of between about 0.5 hours and about 4.5 hours, in accordance with some embodiments. However, any suitable amount of time may be utilized. Exposing the intermediate structure to air for at least 0.5 hours allows the selective etch stop layer 701 to form to sufficient stop layer thicknesses over the gate mask 503 and over the source/drain plugs 603 for further processing to be performed. Furthermore, by limiting the exposure of the intermediate structure to air for no more than 4.5 hours prevents surface corrosion of the source/drain plugs 603 due to moisture (e.g., cobalt corrosion). As such, defects (e.g., DVC or open circuits) are prevented from forming in the devices being formed.

For example, in an embodiment in which the original gate mask 503 comprises silicon nitride, the exposure to air will introduce oxygen to form $SiN_xO_y$. As such, while the gate mask 503 is formed with a first set of elements (e.g., silicon and nitrogen), the selective etch stop layer 701 formed from the material of the gate mask 503 will comprise both the first set of elements (e.g., silicon and nitrogen) as well as at least one or more additional elements (e.g., oxygen).

The selective etch stop layer 701 may be formed to a thickness of between about 1 Å and about 101 Å, according to some embodiments. However, any suitable thickness may be utilized. For devices being formed at the 3 nm node level, the thickness of the selective etch stop layer 701 may be between about 1 Å and about 50 Å over the underlying gate mask 503. As such, the gate contact may be formed to have a relatively low resistance. For devices being formed at levels above the 3 nm node level (e.g., 20 nm, 16 nm, 10 nm, 7 nm, 5 nm nodes), greater thicknesses (e.g., about 1 nm to about 20 nm) may be utilized and still provide a low resistance gate contact. Furthermore, a top surface of the selective etch stop layer 701 may have a profile the same as or similar to top surfaces of the underlying gate mask 503 and the first source/drain plugs 603. Once the selective etch stop layer 701 has been formed, an anneal process (e.g., hydrogen anneal) may be performed.

In some other embodiments, the selective etch stop layer 701 may be formed as an oxide film, e.g., silicon oxide, silicon oxynitride, combinations of these, or the like, using a deposition process such as CVD, PVD, ALD, combinations, or the like. However, any suitable deposition process may be used. As such, a top surface of the selective etch stop layer 701 may have a profile the same as or similar to top surfaces of the underlying gate mask 503 and the source/drain plugs 603.

FIG. 7 further illustrates the formation of a contact etch stop layer (CESL) 703 and a second ILD 705 that are formed over the selective etch stop layer 701, according to some embodiments. The contact etch stop layer 703 may comprise a dielectric material, such as, silicon nitride, silicon oxide, silicon oxynitride, or the like, having a different etch rate than the material of the overlying second ILD 705 and the underlying selective etch stop layer 701 (although the selectivity of the contact etch stop layer 703 to the underlying selective etch stop layer 701 may be below 10). The contact etch stop layer 703 may be deposited by a conformal deposition process, such as ALD, CVD, or the like. As such, a top surface of the contact etch stop layer 703 may have a profile the same as or similar to top surfaces of the underlying selective etch stop layer 701.

The second ILD 705 may be formed of a dielectric material, and may be deposited by any suitable method, such as CVD, PECVD, or FCVD. Suitable dielectric materials may include PSG, BSG, BPSG, USG, or the like. Other insulation materials formed by any acceptable process may be used. After the second ILD 705 is deposited, a planarization process, such as a CMP, may be performed to planarize a top surface of the second ILD 705.

FIG. 7 further illustrates, according to some embodiments, a formation of openings 707 through the second ILD 705 and the contact etch stop layer 703 down to the selective etch stop layer 701. Once the second ILD 705 has been formed, the openings 707 for gate contacts can be formed through the second ILD 705 to the selective etch stop layer 701 using a series of one or more acceptable photolithography and etching techniques. According to some embodiments, a first etching process may be performed using precursors for trifluoromethane ($CHF_3$) and hydrogen ($H_2$) as a carrier gas to etch through the second ILD 705 and punch through the contact etch stop layer 703. In some embodiments, the first etching process may be performed using a precursor/gas ratio of between about 1:1 and about 1:100.

Because the selective etch stop layer 701 is relatively thin (e.g., less than about 5 nm), the first etching process used to form the opening through the contact etch stop layer 703 can be slowed down or even stopped before the first etching process fully punches through the selective etch stop layer 701 and causes further undesired damage. In a particular embodiment, the etch selectivity for the contact etch stop layer 703 can be higher than zero but, because it is intended to slow down the process, does not need to be too high, such as by being about 10 for a selective SiN to oxide etch). As such, the selective etch stop layer 701 is utilize for the formation of the openings 707 as a soft landing region below the contact etch stop layer 703.

Figure 8:
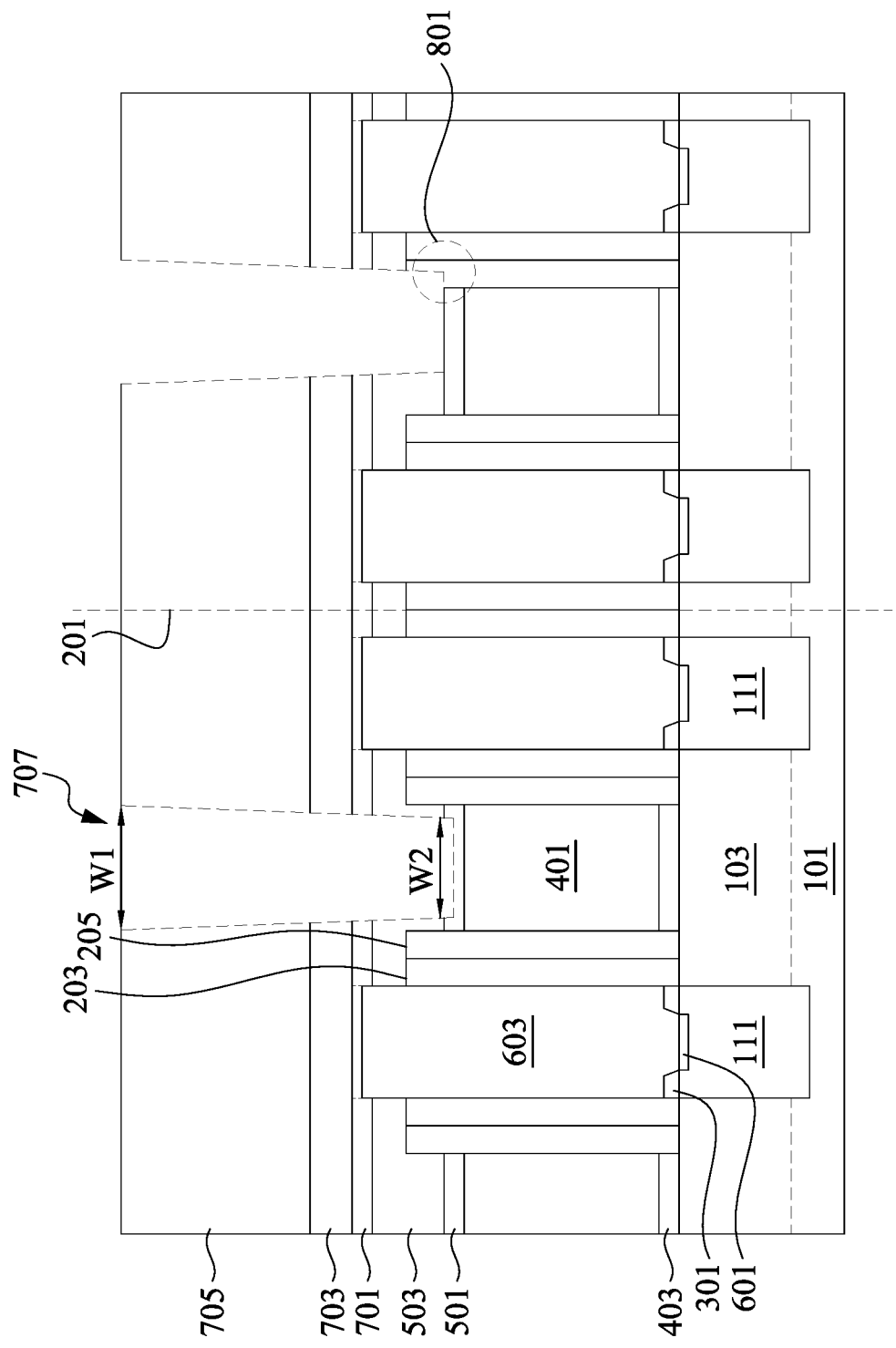

FIG. 8 illustrates, according to some embodiments, a second etching process to extend the openings 707 through the selective etch stop layer 701 and the gate mask 503, stopping on the second etch stop layer 501. According to some embodiments, the second etching process may be performed using precursors for carbon tetrafluoride ($CF_4$) and hydrogen ($H_2$) as a carrier gas to etch through the contact etch stop layer 703 and the gate mask 503. In some embodiments, the second etching process may be performed using a precursor/gas ratio of between about 1:1 and about 1:100. As such, a substantially vertical etch may be obtained for the openings 707. For example, the openings 707 may have a first width W1 at a top of the openings 707 and a second width at the bottom of the openings 707. According to some embodiments, a ratio of the first width W1 to the second width W2 may be between about 1:1 and about 1.5:1.

By forming the openings 707 with the ratio of the first width W1 to the second width W2 being at least 1:1, bridges are prevented from being formed between contacts to be formed in the openings 707 to the metal gates 401 and the source/drain plugs 603. Furthermore, by forming the openings 707 with a tapered profile having the ratio of the first width W1 to the second width W2 being no greater than 1.5:1 avoids leakage between the source/drain plugs 603 and contacts being formed to the metal gates 401.

According to further embodiments and depending on the materials used for the contact etch stop layer 703, the selective etch stop layer 701, and the gate mask 503, other mixed gas chemistries may be used as precursors and carrier gases to form the openings 707. For example, in some embodiments, precursors for $C_xH_yF_z/C_aH_bF_c$, where x/y/z and a/b/c are values between about 0 and about 9, and carrier gases such as $H_2/Ar/He/N_2/O_2$ may be utilized to form the openings 707. Any suitable etchants, and any suitable number or combination of etching processes, may be utilized, and all such etchants and combinations are fully intended to be included within the scope of the embodiments.

FIG. 8 further illustrates a region 801 of an opening 707 that overlaps the optional gate seal spacers 205 and/or the gate spacers 203 (e.g., when the formation of the openings 707 is not perfectly aligned with one of the metal gates 401). The selective etch stop layer 701, having been formed to a sufficient stop layer thickness as described above, provides a soft landing of the first etching process and allows for depth loading control and formation of the openings 707 with a vertical profile while helping to prevent over-etching of the optional gate seal spacers 205. As such, the openings 707 are formed with flat bottom profiles instead of "tigertooth" profiles in the region 801 of the openings 707 when the openings 707 are not precisely located over the metal gates 401.

Figure 9:
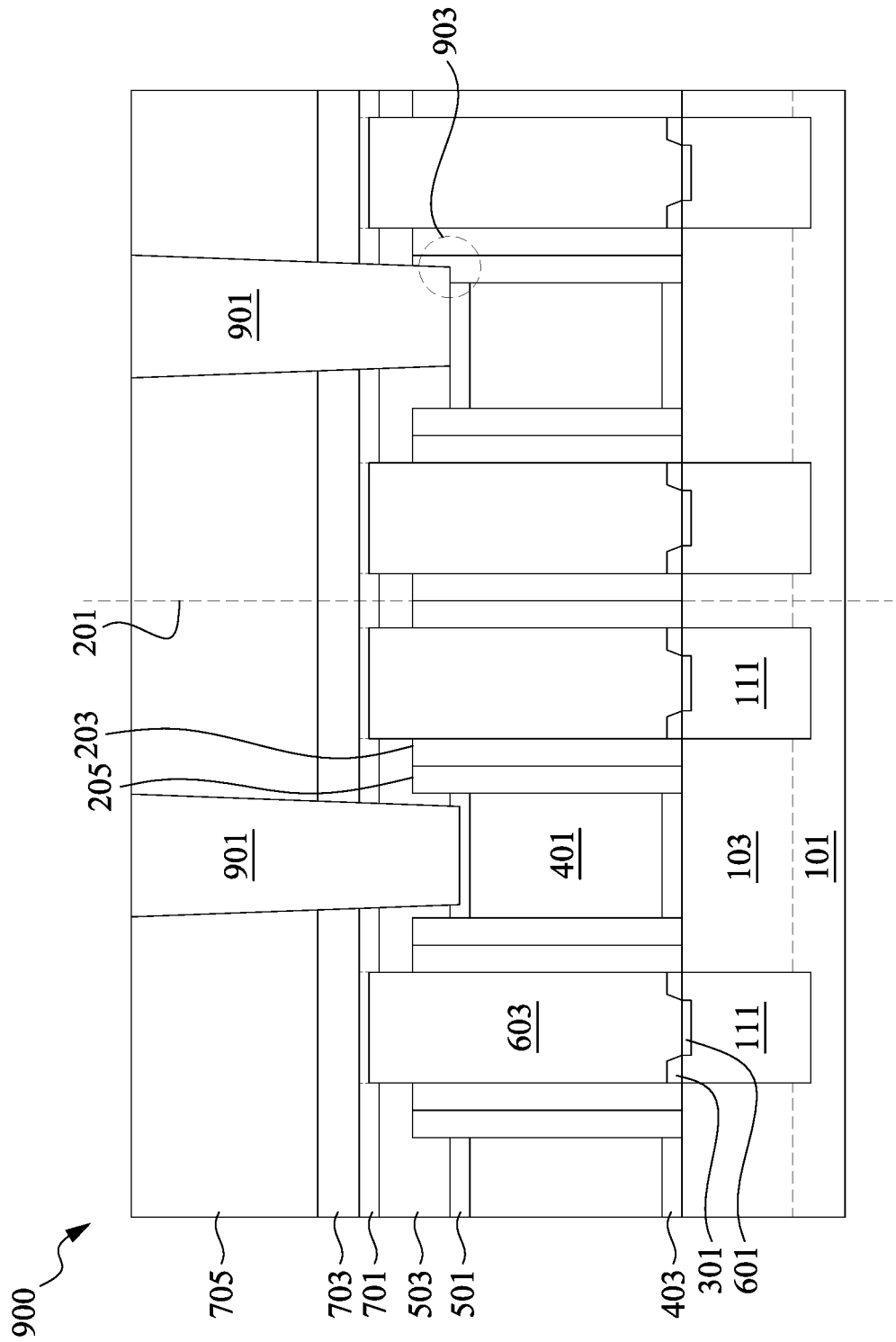

FIG. 9 illustrates a first semiconductor device 900, according to some embodiments. In particular, FIG. 9 illustrates a formation of gate contacts 901 in the openings 707, according to some embodiments. The gate contacts 901 may be formed by forming a liner, such as a diffusion barrier layer, an adhesion layer, or the like, and a conductive material in the openings 707 and over the second etch stop layer 501. As such, the gate contacts 901 are electrically coupled to the metal gates 401 for external contact. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 705. The remaining liner and conductive material form the gate contacts 901 in the openings 707.

FIG. 9 further illustrates a gate edge region 903 of the gate contacts 901 that overlaps the optional gate seal spacers 205 and/or the gate spacers 203. The gate contacts 901 have vertical profiles with flat bottoms instead of a "tiger-tooth" profile in the gate edge region 903 of the gate contacts 901 which is susceptible to leakage at the metal gates 401. As such, the gate contacts 901 provide for a robust device with the gate contact having a relatively low resistance and improved performance.

Additionally, while the formation of the fins 103, the metal gates 401, and the first ILD layer 303 is utilized to describe embodiments formed within finFETs, the disclosed finFET embodiments could also be applied to nanostructure devices such as nanostructure (e.g., nanosheet, nanowire, gate-all-around, or the like) field effect transistors (NS-FETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Figure 10:
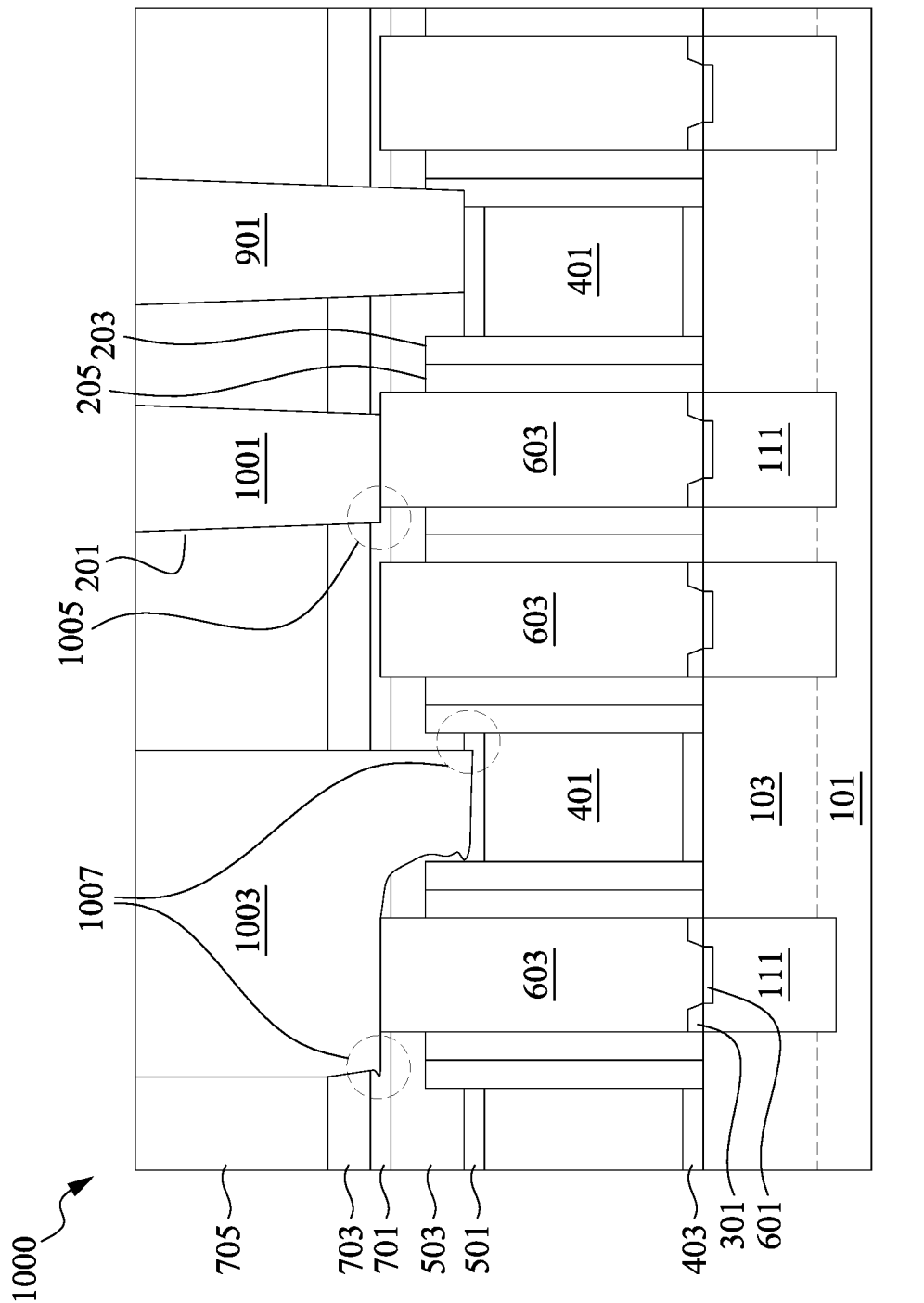

FIG. 10 illustrates a second semiconductor device 1000, according to some other embodiments. In particular, FIG. 10 illustrates a formation of source/drain contacts 1001 and butted contacts 1003 (BCT), according to some embodiments. The butted contacts 1003 may also be referred to herein as VDR contacts or BCT contacts. The source/drain contacts 1001 and/or butted contacts 1003 may be formed by initially forming openings over the source/drain plugs 603 and/or metal gates 401, similar to the openings 707 used to form the gate contacts 901. As such, the selective etch stop layer 701 provides a soft landing for the formation of the openings through the contact etch stop layer 703, provides for substantially vertical profiles for the openings down to the source/drain plugs 603 and/or metal gates 401 and prevents the over-etching of the optional gate seal spacers 205 and formation of "tiger-tooth" profiles at the bottom of the openings. Once the openings for the source/drain contacts 1001 and/or the butted contacts 1003 have been formed, the openings may be filled with liners and conductive materials to form the source/drain contacts 1001 and/or the butted contacts 1003 similar to the formation of the gate contacts 901 described above. As such, the source/drain contacts 1001 and/or the butted contacts 1003 are formed to have substantially vertical profiles and substantially flat bottoms.

FIG. 10 further illustrates a source/drain contact edge region 1005 that extends beyond the edge of the source/drain plugs 603. The source/drain contacts 1001 have vertical profiles with flat bottoms instead of a "tiger-tooth" profile in the source/drain contact edge region 1005 which is susceptible to leakage at the metal gates 401 and/or adjacent source/drain plugs 603. The butted contact 1003 is formed with a vertical profile and substantially flat bottoms in BCT edge regions 1007 and provides similar benefits as those described with the source/drain contacts 1001 and the gate contacts 901. As such, the source/drain contacts 1001 and the butted contacts 1003 also provide for a robust device having a relatively low resistance and improved performance.

The source/drain contacts 1001 are electrically coupled to the source/drain regions 111 through the source/drain plugs 603 and the silicide regions 601. The gate contacts 901 are electrically coupled to the metal gates 401 through the second etch stop layer 501. The butted contacts 1003 are electrically coupled to the source/drain regions 111 through the source/drain plugs 603 and the silicide regions 601 and to the metal gates 401 through the second etch stop layer 501. The source/drain contacts 1001, the gate contacts 901, and the butted contacts 1003 may be formed in different processes, or may be formed in the same process. Although shown as being formed in the same cross-sections, it should be appreciated that each of the gate contacts 901, the source/drain contacts 1001 and/or the butted contacts 1003 may be formed in different cross-sections, which may avoid shorting of the contacts.

As further illustrated in FIG. 10, portions of the butted contacts 1003 physically contact the source/drain plugs 603 and other portions of the butted contacts 1003 physically contact the second etch stop layer 501. As such, the butted contacts 1003 form an electrical connection between a metal gate 401 and a source/drain region 111. The butted contacts 1003 may be useful for forming circuitry in the various regions, such as in an SRAM cell. However, the butted contacts 1003 may be useful in forming other circuitry.

Embodiments disclosed herein may achieve advantages. For example, the selective etch stop layer 701 provides a soft landing region for the first etching process through the contact etch stop layer 703 and allows for depth loading control and formation of the openings 707 having a vertical profile. As such, over-etching of the openings 707 (e.g., leakage) into the optional gate seal spacers 205 and/or the gate spacers 203 can be prevented. Thus, the gate contacts 901, the source/drain contacts 1001, and/or the butted contacts 1003 are formed with flat bottom profiles instead of having "tiger-tooth" profiles at the bottom of the openings 707 leaking into the optional gate seal spacers 205 and/or the gate spacers 203. Furthermore, for devices being formed at the 3 nm node level, the gate contact may be formed to have a relatively low resistance and improved performance.

In accordance with an embodiment, a method includes: forming a first etch stop layer from a portion of a gate mask, the gate mask extending between spacers adjacent a gate electrode, the gate electrode overlying a semiconductor fin; forming a second etch stop layer adjacent the first etch stop layer; forming an opening through the second etch stop layer and exposing the first etch stop layer by performing a first etching process; extending the opening through the first etch stop layer and exposing the gate electrode by performing a second etching process; and forming a gate contact in the opening. In some embodiments of the method, the gate mask includes silicon nitride. In some embodiments of the method, performing the second etching process includes a precursor comprising CF4 and a carrier gas, and using a precursor to carrier gas ratio that is between 1:1 and 1:100, inclusive. In some embodiments of the method, forming the first etch stop layer includes forming a native oxide layer. In some embodiments of the method, forming the first etch stop layer includes performing a plasma treatment using oxygen. In some embodiments of the method, the first etch stop layer is formed to a thickness in a range between about 1 Å and about 50 Å, inclusive. In some embodiments of the method, forming the gate contact forms a butted contact.

In accordance with another embodiment, a method includes: forming a fin over a semiconductor substrate; forming a gate electrode over the fin; forming a contact plug electrically coupled to a source/drain region, the contact plug being adjacent to the gate electrode; treating a gate mask over the gate electrode to form a selective etch stop layer; forming a contact etch stop layer adjacent to the selective etch stop layer; etching an opening through the contact etch stop layer and exposing the selective etch stop layer; etching the opening through the selective etch stop layer and exposing the gate electrode; and forming a gate contact in the opening and electrically coupled to the gate electrode. In some embodiments of the method, the selective etch stop layer is formed to a thickness in a range between about 1 Å and about 50 Å, inclusive. In some embodiments of the method, treating the gate mask includes exposing the gate mask and the contact plug to air. In some embodiments of the method, treating the gate mask includes performing a plasma treatment to the gate mask and the contact plug using oxygen. In some embodiments, the method further includes forming a second opening through the contact etch stop layer and exposing the contact plug. In some embodiments of the method, the gate contact is in physical contact with the contact plug. In some embodiments of the method, treating the gate mask introduces boron. In some embodiments, the method further includes, after forming the selective etch stop layer, performing a hydrogen annealing process.

In accordance with yet another embodiment, a semiconductor device includes: a gate electrode over a fin of a semiconductor substrate; a gate mask over the gate electrode, wherein the gate mask extends between spacers, the spacers being adjacent to the gate electrode, the gate mask including a first set of elements; a source/drain region embedded in the fin and adjacent to the gate electrode; a contact plug over and electrically coupled to the source/drain region; a first etch stop layer over the gate electrode and the gate mask, the first etch stop layer being different from the gate mask and including at least the first set of elements and at least one additional element; a second etch stop layer over and adjacent to the first etch stop layer; and a gate contact through the second etch stop layer and the first etch stop layer, the gate contact being electrically coupled to the gate electrode. In some embodiments of the method, the first etch stop layer has a thickness in a range between about 1 Å and about 50 Å, inclusive. In some embodiments, the method further includes a source/drain contact through the second etch stop layer, the first etch stop layer, and electrically coupled to the contact plug. In some embodiments, the method further includes a butted contact through the second etch stop layer, the first etch stop layer, and electrically coupled to the contact plug and the gate electrode. In some embodiments of the method, the gate mask is silicon nitride and the first etch stop layer is silicon oxynitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first etch stop layer from a portion of a gate mask, the gate mask extending between spacers adjacent a gate electrode, the gate electrode overlying a semiconductor fin and being covered by a conductive etch stop layer, the first etch stop layer comprising a first portion with silicon and a second portion with a metal from a source/drain contact;
   forming a second etch stop layer adjacent the first etch stop layer;
   forming an opening through the second etch stop layer and exposing the first etch stop layer by performing a first etching process;
   extending the opening through the first etch stop layer and exposing the conductive etch stop layer over the gate electrode by performing a second etching process; and
   forming a gate contact in the opening.

2. The method of claim 1, wherein the gate mask comprises silicon nitride.

3. The method of claim 2, wherein the performing the second etching process comprises a precursor comprising $CF_4$ and a carrier gas, and using a precursor to carrier gas ratio that is between 1:1 and 1:100, inclusive.

4. The method of claim 1, wherein the forming the first etch stop layer comprises forming a native oxide layer.

5. The method of claim 1, wherein the forming the first etch stop layer comprises performing a plasma treatment using oxygen.

6. The method of claim 1, wherein the first etch stop layer is formed to a thickness in a range between about 1 Å and about 50 Å, inclusive.

7. The method of claim 1, wherein the forming the gate contact forms a butted contact, and further comprising forming a contact plug electrically coupled to a source/drain region, the contact plug being adjacent to the gate contact.

8. A method comprising:
   forming a first etch stop layer from a portion of a gate mask, the gate mask extending between spacers adjacent a gate electrode, the gate electrode overlying a semiconductor fin, the forming the first etch stop layer introducing oxygen to the portion of the gate mask;
   forming a second etch stop layer adjacent the first etch stop layer;
   forming an opening through the second etch stop layer and exposing the first etch stop layer by performing a first etching process;
   extending the opening through the first etch stop layer and exposing a conductive material in electrical connection with the gate electrode by performing a second etching process; and
   forming a gate contact in the opening.

9. The method of claim 8, wherein the gate mask comprises silicon nitride.

10. The method of claim 9, wherein the performing the second etching process comprises a precursor comprising $CF_4$ and a carrier gas, and using a precursor to carrier gas ratio that is between 1:1 and 1:100, inclusive.

11. The method of claim 8, wherein the forming the first etch stop layer comprises forming a native oxide layer.

12. The method of claim 8, wherein the forming the first etch stop layer comprises performing a plasma treatment using oxygen.

13. The method of claim 8, wherein the first etch stop layer is formed to a thickness in a range between about 1 Å and about 50 Å, inclusive.

14. The method of claim 8, wherein the forming the gate contact forms a butted contact, and further comprising forming a contact plug electrically coupled to a source/drain region, the contact plug being adjacent to the gate contact.

15. A method comprising:
   forming a first etch stop layer from a portion of a gate mask, the gate mask extending between spacers adjacent a gate electrode, the gate electrode overlying a semiconductor fin, the first etch stop layer comprising $SiN_xO_y$ and $Co_xO_y$;
   forming a second etch stop layer adjacent the first etch stop layer;
   forming an opening through the second etch stop layer and exposing the first etch stop layer by performing a first etching process;

extending the opening through the first etch stop layer and exposing a conductive material overlying the gate electrode by performing a second etching process; and forming a gate contact in the opening.

16. The method of claim 15, wherein the gate mask comprises silicon nitride.

17. The method of claim 16, wherein the performing the second etching process comprises a precursor comprising $CF_4$ and a carrier gas, and using a precursor to carrier gas ratio that is between 1:1 and 1:100, inclusive.

18. The method of claim 15, wherein the forming the first etch stop layer comprises forming a native oxide layer.

19. The method of claim 15, wherein the forming the first etch stop layer comprises performing a plasma treatment using oxygen.

20. The method of claim 15, wherein the first etch stop layer is formed to a thickness in a range between about 1 Å and about 50 Å, inclusive.

* * * * *